United States Patent [19]
Ienaka et al.

[11] 4,398,060
[45] Aug. 9, 1983

[54] MUTING CIRCUIT FOR AN FM RADIO RECEIVER

[75] Inventors: Masanori Ienaka, Kodaira; Yoshimi Iso, Yokohama, both of Japan

[73] Assignee: Hitachi, Ltd., Tokyo, Japan

[21] Appl. No.: 290,564

[22] Filed: Aug. 6, 1981

[30] Foreign Application Priority Data

Sep. 17, 1980 [JP] Japan .............................. 55-127982
Sep. 17, 1980 [JP] Japan .............................. 55-127983

[51] Int. Cl.³ .......................................... H04H 5/00
[52] U.S. Cl. .................................. 179/1 GD; 455/194
[58] Field of Search ............ 179/1 GD, 1 GE, 1 GJ, 179/1 GM, 1 P; 455/194, 212, 218, 222, 298, 312

[56] References Cited

U.S. PATENT DOCUMENTS

| | | | |
|---|---|---|---|
| 3,790,714 | 2/1974 | Ohsawa | 179/1 GM |
| 3,919,482 | 11/1975 | Hamada | 179/1 GD |
| 4,029,906 | 6/1977 | Takahashi | 179/1 GJ |
| 4,049,918 | 9/1977 | Ohsawa | 179/1 GJ |
| 4,112,385 | 9/1978 | Kusumi | 179/1 P |
| 4,132,953 | 1/1979 | Martin | 455/218 |
| 4,143,331 | 3/1979 | Page | 330/2 |
| 4,157,455 | 6/1979 | Okatani et al. | 179/1 GM |
| 4,191,851 | 3/1980 | Honma et al. | 179/1 GD |
| 4,244,056 | 1/1981 | Hamada et al. | 455/218 X |

*Primary Examiner*—A. D. Pellinen
*Attorney, Agent, or Firm*—Antonelli, Terry & Wands

[57] ABSTRACT

Signal transmitting operation is effected in a muting circuit when a first constant current source connected to the emitters of first and second transistors is operative with a second constant current source connected to the emitters of third and fourth transistors being inoperative. The signal transmitting operation is not effected in the opposite case. A bias resistor is interposed between the bases of the first and third transistors. To eliminate the popping noise when the power source is turned on, a switching element is connected parallel to the bias resistor and is kept in the ON state for a predetermined period of time after making of the power source.

In an FM radio receiver, the output signal of a detuning detection circuit is applied to the input terminals of first and second mute control circuits, and the muting operation of a pre-amplifier for amplifying a stereo composite signal is controlling by the first mute control circuit while the muting operation of a muting circuit connected to the output of a stereo demodulation circuit is controlled by the second mute control circuit. Discrimination levels of these first and second mute control circuits are set to mutually different levels to eliminate occurrence of the popping noise at the time of changes from tuning to detuning and vice versa.

7 Claims, 10 Drawing Figures

FIG. 1 PRIOR ART    FIG. 2 PRIOR ART
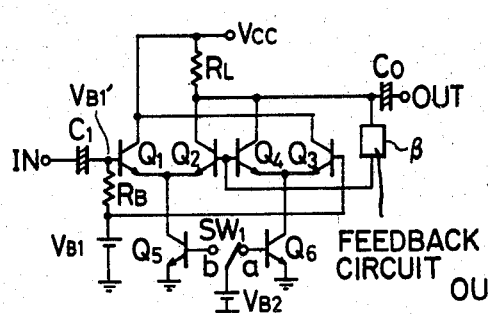
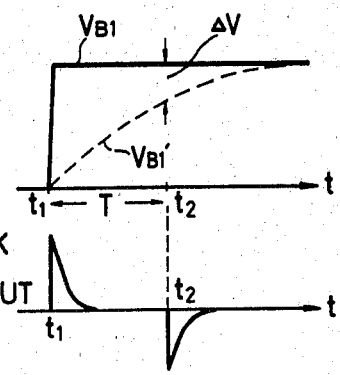
FIG. 3 PRIOR ART
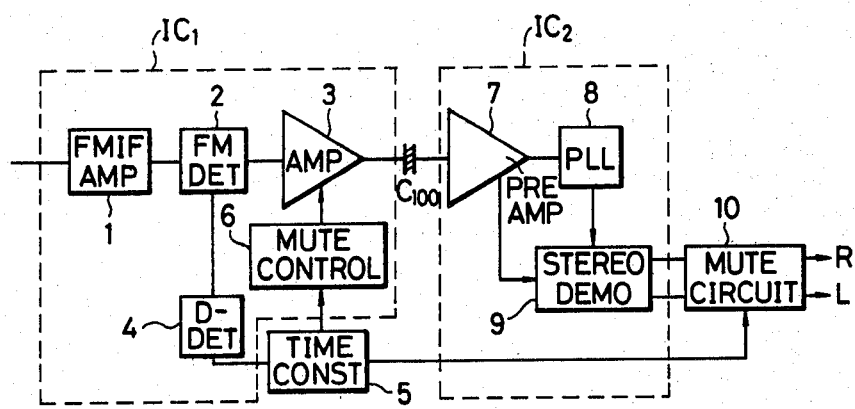
FIG. 4 PRIOR ART
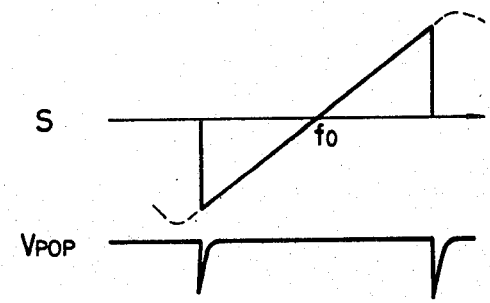

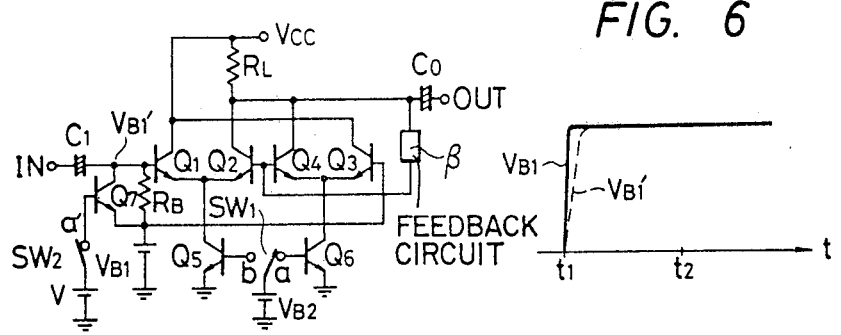
FIG. 5
FIG. 6
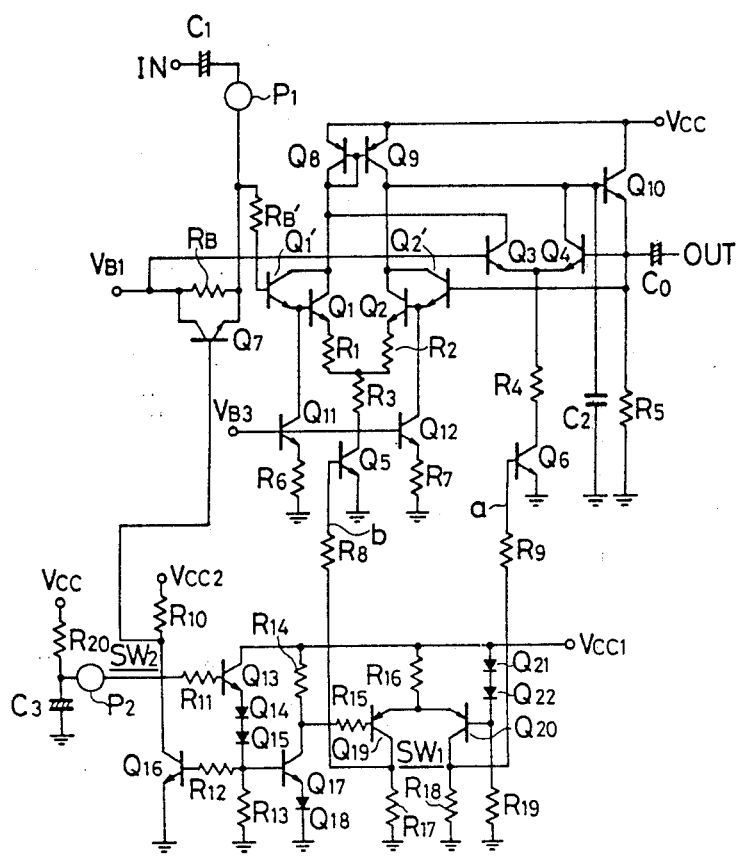
FIG. 7

MUTING CIRCUIT FOR AN FM RADIO RECEIVER

BACKGROUND OF THE INVENTION

This invention relates to a muting circuit and to an FM radio receiver having the muting circuit.

As a muting circuit providing a large signal attenuation, the inventors of the present invention previously proposed a so-called "electronic switching circuit" making use of a differential transistor circuit such as shown in FIG. 1, for example.

In this circuit, collectors of differential amplification transistors $Q_1$, $Q_2$ for signal transmission and those of differential transistors $Q_3$, $Q_4$ for forming a d.c. signal at the time of muting operation are commonly connected, and constant current transistors $Q_5$, $Q_6$ are connected to common emitters of the respective differential transistors $Q_1$, $Q_2$ and to those of $Q_3$, $Q_4$, the constant current transistors $Q_5$, $Q_6$ being selectively and alternately operated by a switch $SW_1$.

An input signal is applied to the base of the differential transistor $Q_1$. A bias voltage $V_{B1}$ is also applied to the base of transistor $Q_1$ via a bias resistor $R_B$, and to the base of the differential transistor $Q_3$ directly. A negative feedback signal is applied to the bases of the transistors $Q_2$, $Q_4$ via a feedback circuit $\beta$, thereby setting the gain of the differential amplification transistor circuit and providing a d.c. bias voltage.

The circuit operates as follows: When the switch $SW_1$ is set to side a, the constant current transistor $Q_5$ becomes inoperative while the constant current transistor $Q_6$ becomes operative so that the differential amplification transistors $Q_1$, $Q_2$ are turned off while the differential transistors $Q_3$, $Q_4$ are turned on. Consequently, only the same d.c. signal as the bias voltage $V_{B1}$, that is formed by the differential transistors $Q_3$, $Q_4$, can be obtained at the output OUT.

On the other hand, when the switch $SW_1$ is set to side b, the differential amplification transistors $Q_1$, $Q_2$ become operative and transmit the input signal IN. Accordingly, a large signal attenuation can be obtained without changing the output d.c. signal.

The inventors of the present invention found that in this muting circuit when the input signal IN is applied via a coupling capacitor $C_1$ the following problem occurs.

Namely, it is possible to assume that the input terminal IN in FIG. 1 is substantially grounded through the practically negligible impedance of a signal source (not shown), so that the bias voltage $V_{B1}$ rises immediately at the time $t_1$, immediately after connecting the power source as shown in FIG. 2, whereas the voltage $V_{B1}$' at the junction between the coupling capacitor $C_1$ and the bias resistor $R_B$ gradually rises due to the time constant of capacitor $C_1$ and resistor $R_B$.

Accordingly, if the switch $SW_1$ is kept closed to the side a during a predetermined period from the time $t_1$ to the time $t_2$, the base voltage of both differential amplification transistors $Q_3$, $Q_4$ is equal to the bias voltage $V_{B1}$ and consequently, the collector potential of the transistor $Q_4$ becomes $V_{B1}/\beta$. Since an output coupling capacitor $C_o$ connected to the output terminal OUT and the impedance of a load (not shown) form a differential circuit together, the waveform obtained by differentiating the collector potential $V_{B1}/\beta$ of the transistor $Q_4$ occurs at the output terminal OUT at the time t, as depicted in the waveform diagram of FIG. 2. This transient response waveform occurring at the time $t_1$ eventually results in a popping noise, but can be prevented by arranging a muting circuit (not shown) at a subsequent stage of this circuit.

When the switch $SW_1$ is switched from side a to side b at the time $t_2$, the base of the transistor $Q_2$ is biased by the bias voltage $V_{B1}$ whereas the base of transistor $Q_1$ is biased by the voltage $V_{B1}$' which is lower than the bias voltage $V_{B1}$. Consequently, since a voltage difference $\Delta V$ as shown in the waveform diagram of FIG. 2 is applied between the bases of the differential amplification transistors $Q_1$ and $Q_2$, the collector potential of the transistor $Q_2$ drops drastically at the time $t_2$. The waveform obtained by differentiating this collector potential by the output coupling capacitor $C_o$ and the impedance of the load occurs at the output terminal OUT at the time $t_2$ as shown in the waveform diagram of FIG. 2.

The inventors of the present invention have found that prevention of the popping noise at the time $t_2$ can be accomplished by reducing the time constant at the rise of the voltage $V_{B1}$' to an extremely small value. Accordingly, the inventors examined the idea of reducing the capacitance of the coupling capacitor $C_1$, but this plan was abandoned because a problem of phase inversion of low frequency signals arises.

Reducing the resistance of the bias resistor $R_B$ was attempted, but this plan was also abandoned because of the lowering of the input impedance at the input terminal IN.

Occurrence of the popping noise due to the transient response waveform at the time $t_2$ can be prevented by disposing another muting circuit (not shown) at a subsequent stage of this circuit, but when the capacitance of the coupling capacitor and the resistance of the bias resistor $R_B$ are set to about 10 $\mu$F and about 40 K$\Omega$, respectively, the muting time of the muting circuit disposed at the subsequent stage of this circuit must be set to as long as about three seconds. If the muting operation is carried out for such a relatively long period after turning on the power source, however, the listener of the radio receiver would think that the radio receiver was out of order.

On the other hand, as one of the additional functions of an FM radio receiver, a muting circuit for eliminating offensive noise between stations during selection of the stations has heretofore been known, as disclosed in "HI-FI FM TUNER", p. 193-199, published on Aug. 20, 1976 by Nippon Hoso Kyokai, for example.

FM radio receivers employing this muting circuit in a monolithic semiconductor integrated circuit for FM intermediate frequency amplification and detection are commercially available from RCA, U.S.A., under the tradename "CA3089E", and from Hitachi Limited, Japan, under the tradename "HA1137W".

FIG. 3 shows a block diagram of an FM radio receiver including the monolithic semiconductor integrated circuit. This radio receiver was examined by the inventors of the present invention prior to the filing of this patent application.

In the drawing, symbol $IC_1$ represents the monolithic semiconductor integrated circuit for FM intermediate frequency amplification and detection. This integrated circuit includes an FM intermediate frequency amplification stage 1, an FM detection stage 2, a low frequency amplication stage 3, a detuning detection circuit 4, and a mute control circuit 6 for controlling the muting operation at the low frequency amplification stage 3. Additionally, this monolithic semiconductor integrated circuit includes an AFC circuit and a level detection circuit, the output signals of which are used as the input signals to the detuning detection circuit 4. Reference numeral 5 represents a time constant circuit which is disposed for removing high frequency components contained in the detuning detection signal.

Symbol $IC_2$ represents a monolithic semiconductor integrated circuit for FM stereo demodulation. This integrated circuit includes a pre-amplifier 7, a PLL (phase locked loop) circuit 8 for forming a 38 KHz switching signal synchronous with a 19 KHz pilot signal contained in a stereo composite signal, and a stereo demodulation circuit 9. The stereo composite signal formed by the FM detection circuit 2 is applied to the input of the pre-amplifier 7 via a coupling capacitor $C_{100}$ while the stereo demodulation circuit 9 forms stereo demodulated signals L, R of the left and right channels by receiving at its input the stereo composite signal passing through the pre-amplifier 7 and the 38 KHz switching signal formed by the PLL circuit 8.

The monolithic semiconductor integrated circuit $IC_2$ also includes additional circuits for stereo-monaural detection, selection, display, and the like.

In the above monolithic semiconductor integrated circuit $IC_1$, the popping noise $V_{pop}$ originates from the FM detection stage 2 due to changes in the d.c. voltage in the S characteristic curve of the FM detection circuit 2 as shown in FIG. 4 during the muting operation for changing over from tuning to detuning upon detection of detuning.

Accordingly, the inventors of the present invention examined the possibility of providing a muting circuit 10 at the output of the stereo demodulation circuit 9 as the subsequent stage. In such a case, the muting circuit 10 must exhibit fast mute-release timing for shifting from detuning to tuning and retarded mute timing for shifting from tuning to detuning in its muting operation in the monolithic semiconductor integrated circuit $IC_1$. Since these muting operations are independently controlled, the timings are difficult to set and are highly susceptible to variance of element characteristics.

Moreover, the coupling capacitor $C_{100}$ is interposed between the two muting circuits 6 and 10 and causes a time advance of the signal to the subsequent muting circuit, so that it becomes extremely difficult for the subsequent muting circuit 10 to eliminate the popping noise generated in the preceding muting circuit 6.

SUMMARY OF THE INVENTION

It is an object of the present invention to provide a muting circuit which prevents the occurrence of a popping noise at the time of mute release after turning on the power source.

It is another object of the present invention to provide an FM radio receiver which is capable of reliably eliminating the popping noise.

In accordance with a fundamental characteristic feature of the first invention of this application, in a muting circuit making use of an electronic switching circuit, a bias resistor disposed at the base of an amplification transistor for signal transmission is short-circuited by a switching means for a predetermined period from immediately after turning on the power source until the muting operation is released.

In accordance with a fundamental characteristic feature of the second invention of this application, mute control circuits receiving the same tuning or detuning detection signal and having mutually different discrimination levels are employed so that the operation start timing of the muting circuit at the later stage is set earlier than that of the muting circuit at the prior stage whereas the operation release timing of the later stage is set later than that of the prior stage.

BRIEF DESCRIPTION OF THE DRAWINGS

FIG. 1 is a circuit diagram of the muting circuit that was proposed by the inventors of the present invention prior to the present application;

FIG. 2 is an operation waveform diagram of the circuit of FIG. 1;

FIG. 3 is a block diagram of the FM radio receiver that was proposed by the inventors of the present invention prior to the present application;

FIG. 4 is an operative waveform diagram of the receiver of FIG. 3;

FIG. 5 is a circuit diagram in accordance with an embodiment of the first invention;

FIG. 6 is an operative waveform diagram of the embodiment of FIG. 5;

FIG. 7 is a circuit diagram in accordance with another embodiment of the first invention;

DESCRIPTION OF THE PREFERRED EMBODIMENTS

Figure 8:
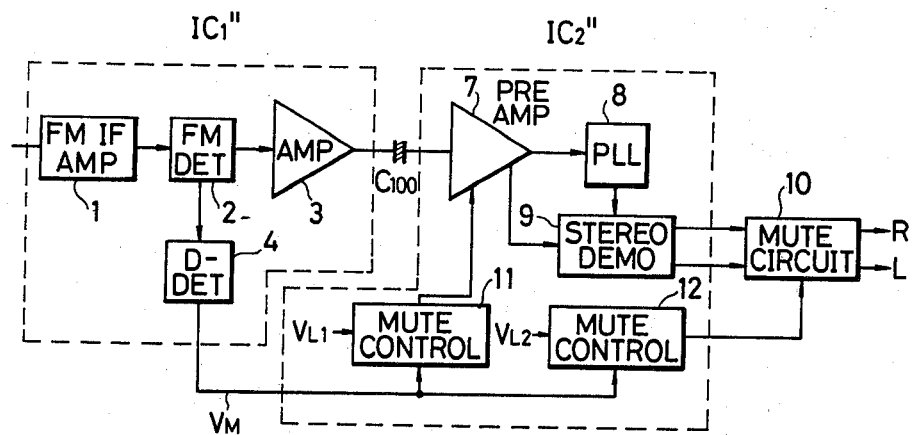
FIG. 8 is a block diagram of an FM radio receiver in accordance with an embodiment of the second invention.

Hereinafter, the present invention will be described in detail with reference to embodiments thereof.

FIG. 5 shows a circuit diagram of an embodiment of the first invention of this application.

In this circuit, the collectors of differential amplification transistors $Q_1$, $Q_2$ for signal transmission and those of the differential transistors $Q_3$, $Q_4$ for forming the d.c. signal at the time of the muting operation are connected together as in the aforementioned circuit, and the constant current transistors $Q_5$, $Q_6$ that are alternately operated by the switch $SW_1$ are connected to the common emitters of the respective differential transistors $Q_1$, $Q_2$ and $Q_3$, $Q_4$.

The bias voltage $V_{B1}$ is applied to the base of the differential amplification transistor $Q_1$, to which the input signal IN is also applied, via the bias resistor $R_B$, while the bias voltage $V_{B1}$ is applied to the base of the differential transistor $Q_3$ directly. A negative feedback signal is applied to the bases of the transistors $Q_2$, $Q_4$ via the feedback circuit $\beta$, thereby setting the gain of the differential amplification transistor circuit and providing the d.c. bias voltage.

The load resistor $R_L$ is connected to the collectors of the transistors $Q_2$, $Q_4$ and also to the output terminal OUT. An input signal IN is applied to the base of the transistor $Q_1$ via the coupling capacitor $C_1$.

In the circuit of this embodiment, a switching transistor $Q_7$ is disposed in parallel to the bias resistor $R_B$ in order to prevent occurrence of the popping noise at the time of mute release after turning on the power source, and is controlled by a voltage V applied via a switch $SW_2$. This switch $SW_2$ is connected to side a', for example, when the power source is applied, thereby turning on the transistor $Q_7$. The transistor $Q_7$ is kept ON until the switch $SW_1$ is changed over to the side b or before the release of the muting operation, and is turned off after the release of the muting operation. It is therefore preferred that both switches $SW_1$ and $SW_2$ be operated in an interlocking arrangement by the same control signal.

The muting operation by the switch $SW_1$ when the power source in this circuit is turned on is the same as in the aforementioned circuit, and so its explanation is deleted. In this embodiment, the bias resistor $R_B$ is short-circuited by the transistor $Q_7$ turned on by the switch $SW_2$ immediately after the power source is turned on. As shown in the operative waveform diagram of FIG. 6, therefore, the base voltage $V_{B1}'$ of the differential amplification transistor $Q_1$ substantially follows the bias voltage $V_{B1}$, which rises drastically immediately after the power source is turned on (at the time $t_1$). Accordingly, when the switch $SW_1$ is changed over to side b at time $t_2$ to release the muting operation, both bias voltages $V_{B1}$ and $V_{B1}'$ become equal to each other so that occurrence of the popping noise can be prevented.

Incidentally, the voltage fluctuation occurring at the time $t_1$ immediately after turning on the power source (or the popping noise) can be eliminated by the muting circuit of the subsequent stage which also functions to protect the speaker connected to a power amplifier that is simultaneously turned on. As described above, however, when the popping noise occurs at the time $t_2$, the muting operation of the muting circuit at the subsequent stage has already released so that the amplification circuit at the subsequent stage is operative and the voltage fluctuation is amplified as a loud popping noise.

FIG. 7 shows a circuit in accordance with an embodiment of the first invention.

The circuit of this embodiment includes circuit elements that are formed on a single chip silicon substrate in accordance with the known fabrication method of a semiconductor device. However, a capacitor $C_1$, a resistor $R_{20}$ and a capacitor $C_3$ connected via terminals $P_1$, $P_2$ are formed by external components. The muting circuit of this embodiment also functions as a pre-amplifier for a stereo demodulation circuit or the like in an FM stereo tuner or the like, for example.

Accordingly, the differential amplification transistor circuit for signal transmission is composed of transistors $Q_1$, $Q_1'$ and $Q_2$, $Q_2'$ in the Darlington circuit arrangement in order to realize high input impedance and to increase open loop gain, whereby the emitters of the transistors $Q_1'$, $Q_2'$ on the input side are furnished with constant current source circuits formed by transistors $Q_{11}$, $Q_{12}$ and resistors $R_6$, $R_7$, respectively. The emitters of the transistors $Q_1$, $Q_2$ are connected together via emitter resistors $R_1$, $R_2$, and a resistor $R_3$ is disposed between the junction of these resistors and the collector of the constant current transistor $Q_5$.

A similar resistor $R_4$ is disposed between the collector of the constant current transistor $Q_6$ and the emitters of the differential transistors $Q_3$, $Q_4$ which are connected to each other.

A current mirror circuit is disposed at the collectors of the amplification transistors $Q_1$, $Q_2$ as a load, and is composed of transistors $Q_8$, $Q_9$.

This amplified output is applied to an emitter follower output circuit consisting of a transistor $Q_{10}$ and a resistor $R_5$.

An output signal is obtained from its output terminal OUT and is fed back to the bases of the transistors $Q_4$ and $Q_2'$. A capacitor $C_2$ for preventing oscillation or the like is connected to the base of the emitter follower transistor $Q_{10}$, the capacitor being an MOS (metal oxide semiconductor) capacitor, for example.

A resistor $R_B'$ for preventing electrostatic breakdown or the like is connected to the base of the input amplification transistor $Q_1'$.

In this embodiment, an example of a concretely realized circuit of the switches $SW_1$, $SW_2$ is illustrated.

When the power source is turned on, an integration voltage from the RC circuit $R_{20}$, $C_3$ connected to a terminal $P_2$ is applied to the base of the transistor $Q_{13}$ via a resistor $R_{11}$. Level shift diodes $Q_{14}$, $Q_{15}$ (the term "diode" will hereinafter include transistors of a diode-type) and a resistor $R_{13}$ are connected in series to the emitter of transistor $Q_{13}$. The voltage drop across resistor $R_{13}$ is applied to the base of the transistor $Q_{16}$ via resistor $R_{12}$. Resistor $R_{10}$ is interposed between the collector of this transistor $Q_{16}$ and a power source voltage $V_{cc2}$, which is higher than the bias voltage $V_{B1}$. The collector voltage of transistor $Q_{16}$ is applied to the base of transistor $Q_7$ as its controlling signal.

Accordingly, the transistor $Q_{16}$ and the resistor $R_{10}$ together form the switch $SW_2$.

The voltage drop across resistor $R_{13}$ is applied to the base of the transistor $Q_{17}$, and a diode $Q_{18}$ is connected to the emitter of this transistor $Q_{17}$ as a constant voltage source. Further, a resistor $R_{14}$ is disposed between the collector of transistor $Q_{17}$ and the stabilized power source voltage $V_{cc1}$.

On the other hand, a voltage from the power source voltage $V_{cc1}$ which has been level-shifted by level shift diodes $Q_{21}$, $Q_{22}$ and a resistor $R_{19}$ is applied to the base of a transistor $Q_{20}$ while the collector voltage of transistor $Q_{17}$ is applied to the base of a transistor $Q_{19}$, and the emitters of these transistors $Q_{19}$, $Q_{20}$ are connected to each other and to the power source voltage $V_{cc1}$ via a resistor $R_{16}$.

These transistors $Q_{19}$, $Q_{20}$ are p-n-p transistors whose collectors are equipped with resistors $R_{17}$, $R_{18}$, respectively. The collector voltages of these transistors $Q_{19}$, $Q_{20}$ are applied as the controlling signals to the bases of the constant current transistors $Q_5$, $Q_6$ via the resistors $R_8$, $R_9$, respectively. Accordingly, these circuit elements form the switch $SW_1$.

The operation of these switches $SW_1$, $SW_2$ is as follows.

During the period from immediately after the power source is turned on until its integrated voltage at the terminal $P_2$ reaches 4 $V_{BE}$ (base-emitter voltage of the transistor or forward voltage of the diode), the transistor $Q_{16}$ is kept off so that the base voltage of the transistor $Q_7$ is as high as the power source voltage $V_{cc2}$, and hence the transistor $Q_7$ is turned on.

When the voltage exceeds the abovementioned voltage 4 $V_{BE}$, the transistor $Q_{16}$ is turned on so that the transistor $Q_7$ is turned off.

On the other hand, since the transistor $Q_{17}$ is kept off during the period before the abovementioned integration voltage reaches 5 $V_{BE}$, the differential transistor $Q_{19}$ is kept off while the differential transistor $Q_{20}$ is kept on. Accordingly, the constant current transistor $Q_6$ is operative while the constant current transistor $Q_5$ is inoperative, thereby performing the same operation as when switch $SW_1$ is set to side a. Thus, the muting operation is carried out.

When the voltage at the terminal $P_2$ exceeds 5 $V_{BE}$, the transistor $Q_{17}$ is turned on so that the differential transistor $Q_{19}$ is turned on with the differential transistor $Q_{20}$ being turned off. Consequently, the constant current transistor $Q_5$ is operative while the constant current transistor $Q_6$ is inoperative, thereby performing the same operation as when switch $SW_1$ is set to side b. Hence, muting is released and signal transmission is started.

Accordingly, the circuit of this embodiment is constructed so that the switching transistor $Q_7$ is turned off before the muting operation is released.

The first invention of the present application is not limited, in particular, to the abovementioned embodiment, and the definite example of the circuit for switches $SW_1$, $SW_2$ can be modified in various ways. It is possible, for example, to employ a construction in which the constant current transistors $Q_5$, $Q_6$ are compulsively and alternatively turned off when the switching transistors are turned on.

As the switching means for short-circuiting the base bias resistor $R_B$, an MOSFET or the like may also be employed.

The first invention of this application can be widely applied as a muting circuit in a variety of audio equipment and devices.

FIG. 8 is a block diagram showing the principal portions of an embodiment of an FM radio receiver in accordance with the second invention of the present application.

Symbol $IC_1''$ represents an FM intermediate frequency amplification-detection monothilic semiconductor integrated circuit which includes an FM intermediate frequency amplification stage 1, an FM detection stage 2, a low frequency amplification stage 3 and a detuning detection circuit 4 and in which the mute control circuit is deleted in the low frequency amplification stage 3. Except in that the mute control circuit is deleted, this integrated circuit is the same as the aforementioned monolithic semiconductor integrated circuit $IC_1$ for FM intermediate frequency amplification and detection. However, the aforementioned commercial product "HA1137W" can be used as the monolithic semiconductor integrated circuit $IC_1''$ for FM intermediate frequency amplification and detection in this embodiment by rendering its mute control circuit 6 inoperative.

Symbol $IC_2''$ represents a monolithic semiconductor integrated circuit for FM stereo demodulation. Except those points which will hereinafter be described, this circuit is analogous to the aforementioned monolithic semiconductor integrated circuit $IC_2$ such as one disclosed in the magazine "ELECTRONICS", pages 62-66, November, 1971 or to a circuit available commercially from Hitachi Limited under the tradename "HA1196", or the like.

In the monolithic semiconductor integrated circuit $IC_2''$ for FM stereo demodulation in this embodiment, the muting function is added to the pre-amplifier 7, and a first mute control circuit 11 for controlling this muting function as well as a second mute control circuit 12 for controlling a muting circuit 10 disposed in the stereo demodulation output are additionally disposed. A detection signal formed by the detuning detection circuit 4 is applied to these mute control circuits 11, 12 together, and different detection levels $V_{L1}$, $V_{L2}$ are provided to discriminate necessary mute control.

Figure 9:
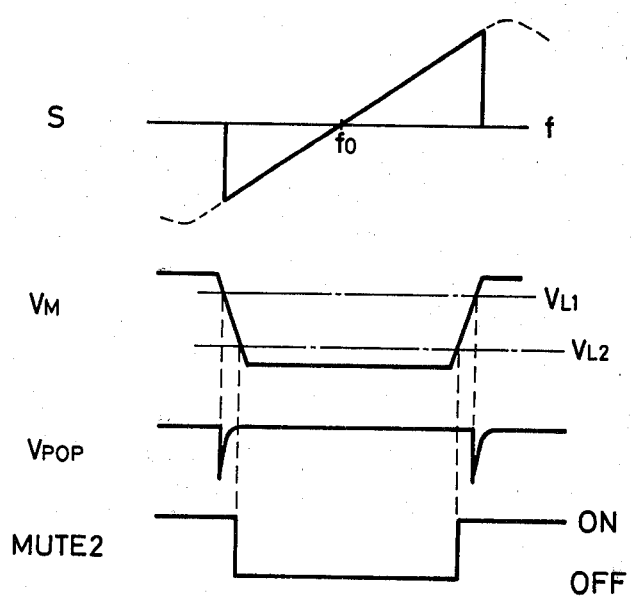
FIG. 9 is an operative waveform diagram of the embodiment of FIG. 8.

Namely, as shown in FIG. 9, the discrimination level $V_{L1}$ of the first mute control circuit 11 is set to the high level while the discrimination level $V_{L2}$ of the second mute control circuit 12 is set to the low level so as to read the level difference from a detuning detection signal $V_M$ of the detuning detection circuit 4, which becomes high level when the tuning frequency deviates excessively from the center frequency $f_o$ of the S characteristic of the FM detection stage 2 and becomes low level when tuning is established.

Accordingly, when detuning changes to tuning and the muting operation is released, the detuning detection signal $V_M$ reaches a level below the first discrimination level $V_{L1}$ so that the muting operation in the pre-amplifier 7 is released before the muting operation of the muting circuit 10 is released. In this instance, the voltage fluctuation $V_{pop}$ occurs due to the change in the d.c. voltage in the S characteristic but since the muting operation in the muting circuit 10 is not yet released, the occurrence of the popping noise is eliminated.

On the other hand, when tuning changes to detuning and the muting operation starts, the detuning detection signal $V_M$ first reaches a level above the second discrimination level $V_{L2}$ so that muting of the pre-amplifier 7 is started after the muting operation of the muting circuit 10. Accordingly, the popping noise occurring for the reason noted above is eliminated by muting circuit 10 which has already started its muting operation.

In this embodiment, since the mute control circuits 11, 12 are constructed by the same monolithic semiconductor integrated circuit $IC_2$, the discrimination levels $V_{L1}$, $V_{L2}$ for restricting their mute control operation are not affected by variance of the semiconductor elements, and consequently the mute control operation can be set to a high level of accuracy as described above.

Since no circuit element for shortening the signal transmission time such as a coupling capacitor $C_{100}$ is interposed between the muting circuit in the pre-amplifier 7 and the muting circuit 10 for the stereo demodulation circuit 9, it is possible to make the timing difference for the start and release of the muting operation, corresponding to the level difference of the discrimination levels $V_{L1}$, $V_{L2}$, coincide with the time difference for the elimination of the popping noise.

In other words, the popping noise can reliably be eliminated by a simple circuit design in which the level difference between $V_{L1}$ and $V_{L2}$ is set in accordance with the pulse width of the popping noise.

Incidentally, sufficient attenuation to eliminate noises between broadcasting stations can not be obtained by use of merely the muting circuit 10. Hence, it is necessary to dispose two muting circuit as described above.

Figure 10:
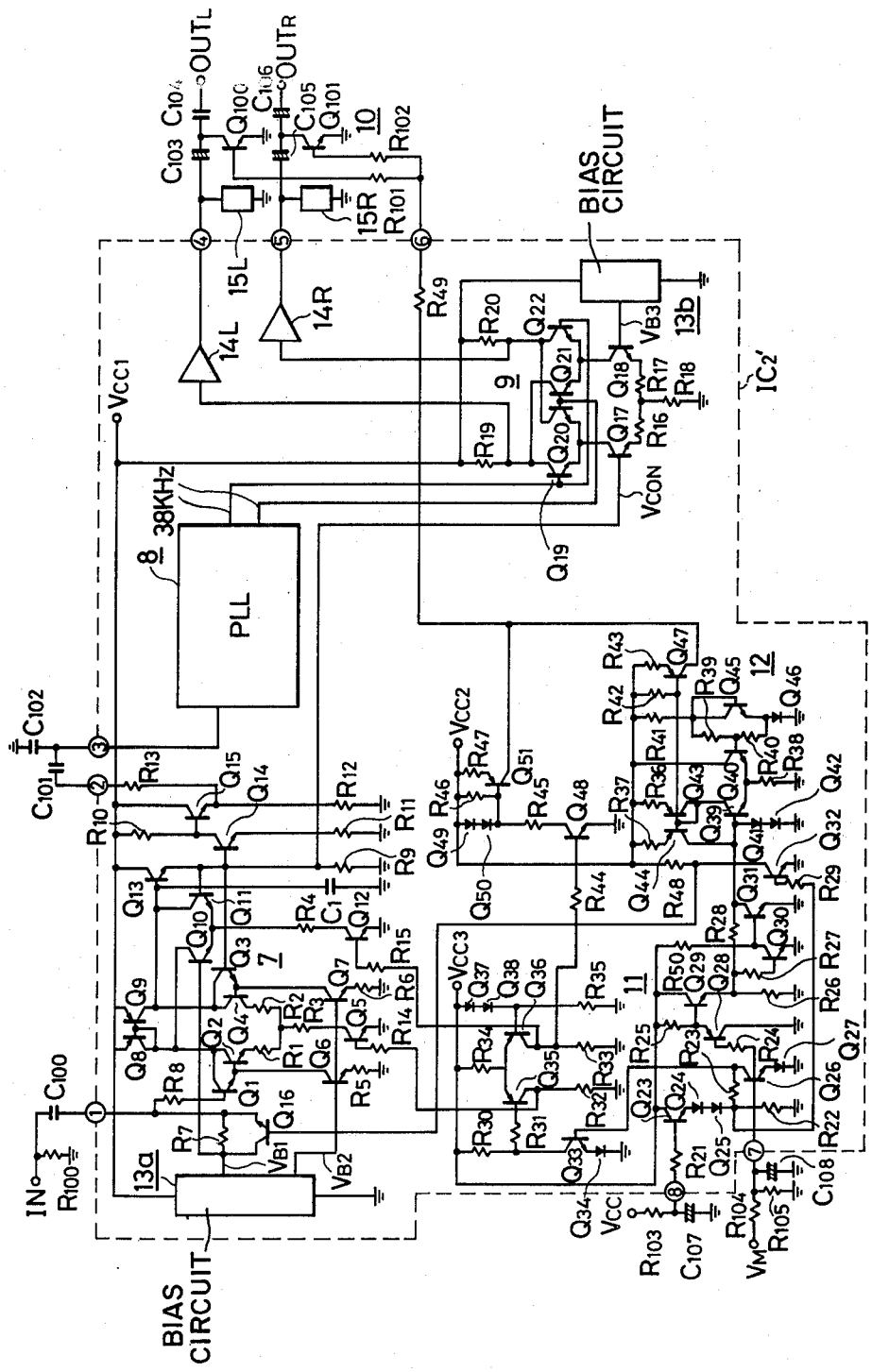
FIG. 10 is a circuit diagram showing the principal portions of the second invention.

FIG. 10 is a circuit diagram of an embodiment of this second invention.

In the drawing, the circuit elements of the portion $IC_2'$ encircled by dotted lines are formed on one silicon semiconductor chip by the known fabrication method of semiconductors, and encircled numerals represent terminal numbers.

In the pre-amplifier 7, differential amplification transistors $Q_1$, $Q_2$ and $Q_3$, $Q_4$ for the signal transmission of the input signal IN from the low frequency amplification stage 3 are connected to each other in a Darlington arrangement with their collectors respectively connected together, while the collectors of differential trasistors $Q_{10}$, $Q_{11}$ for forming the d.c. signal at the time of the muting operation are connected, respectively, to the collectors of the former. Constant current circuits consisting of transistors $Q_6$, $Q_7$ and resistors $R_5$, $R_6$, respectively, are connected to the emitters of the input transistors $Q_1$, $Q_3$ in the Darlington configuration, respectively, and the bias constant voltage $V_{B2}$ is applied to the bases of these transistors $Q_6$, $Q_7$. The emitters of the transistors $Q_2$, $Q_4$ are connected to each other via emitter resistors $R_1$, $R_2$, respectively, and a resistor $R_3$ is disposed between the junction of these resistors and the collector of the constant current transistor $Q_5$. A similar resistor $R_4$ is disposed between the emitters of the differential transistors $Q_{10}$, $Q_{11}$, that are connected to each other, and the collector of the constant current transistor $Q_{12}$.

A current mirror circuit consisting of transistors $Q_8$, $Q_9$ is connected as a load to the mutually connected collectors of the differential amplification transistors $Q_1$, $Q_2$ and $Q_3$, $Q_4$ and to the mutually connected connectors of the differential transistors $Q_{10}$, $Q_{11}$.

This amplification output is applied to an emitter follower output circuit consisting of a transistor $Q_{13}$ and a resistor $R_9$. A negative feedback signal is obtained from the output of the emitter follower output circuit to be fed back to the bases of the trasistors $Q_3$, $Q_{11}$ and an output signal (composite signal $V_{CON}$) to be applied to a stereo demodulation circuit 9 that will be described elsewhere. The composite signal is produced as an output from a second terminal via an inverting amplifier circuit consisting of a transistor $Q_{14}$, a collector resistor $R_{10}$ and an emitter resistor $R_{11}$, and via an emitter follower circuit consisting of a transistor $Q_{15}$ and an emitter resistor $R_{12}$.

A capacitor $C_1$ for preventing oscillation or the like is connected to the base of the abovementioned transistor $Q_{13}$, and this capacitor could composed of an MOS (metal oxide semiconductor) capacitor, for example.

The base bias voltage $V_{B1}$ is applied to the base of the input differential amplification transistor $Q_1$ via a base bias resistor $R_7$ and is applied to the base of the differential transistor $Q_{10}$ directly.

The base of the abovementioned transistor $Q_1$ is connected to the first terminal via a resistor $R_8$ which is disposed for preventing dielectric breakdown. A composite input signal IN (in the case of the stereo broadcasting) is applied to this first terminal as an FM detection output signal through a coupling capacitor $C_{100}$. Reference numeral 13a represents a bias circuit which forms the abovementioned bias voltages $V_{B1}$, $V_{B2}$.

In this pre-amplifier 7, either one of the constant current transistors $Q_5$, $Q_{12}$ is alternatively actuated in order carry out the signal transmission of the input signal IN or the muting operation.

Namely, when the constant current transistor $Q_5$ is operative with the constant current transistor $Q_{12}$ kept off, the differential transistors $Q_{10}$, $Q_{11}$ are turned off while the differential amplification transistors $Q_2$, $Q_4$ operate so that the input signal IN is transmitted. In the opposite case, the differential amplification transistors $Q_2$, $Q_4$ are turned off with the differential transistors $Q_{10}$, $Q_{11}$ being operative so that the signal transmission of the input signal IN is inhibited and muting is carried out. In this case, only the same d.c. signal as the bias voltage $V_{B1}$ is obtained at the emitter output of the transistor $Q_{13}$ due to the operation of the differential transistors $Q_{10}$, $Q_{11}$.

In this embodiment, a transistor $Q_{16}$ for short-circuiting the bias resistor $R_7$ is disposed across both ends of this resistor in order to prevent occurrence of the popping noise when the power source is turned on.

Emitters of differential transistors $Q_{35}$, $Q_{36}$ are connected to a stabilized power source voltage $V_{cc3}$ via a resistor $R_{34}$, and resistors $R_{32}$, $R_{33}$ are connected to the collectors of these transistors, respectively. These transistors $Q_{35}$, $Q_{36}$ together form a switching circuit for alternatively actuating either one of the constant current transistors $Q_5$ and $Q_{12}$.

Namely, a voltage ($V_{cc3} - 2V_{BE}$) generated by level shift diodes $Q_{37}$, $Q_{38}$ (the term "diode" will hereinafter include transistors of the diode type) and a resistor $R_{35}$ is applied to the base of the transistor $Q_{36}$. A diode $Q_{34}$ is connected to the emitter of the transistor $Q_{33}$ as a constant voltage element and a resistor $R_{30}$ is connected to its collector. A control voltage is applied to the base of this transistor $Q_{33}$, whose collector voltage is in turn applied to the base of the abovementioned transistor $Q_{35}$ via a resistor $R_{31}$. Accordingly, when the transistor $Q_{33}$ is kept on, the transistor $Q_{35}$ is turned on while the transistor $Q_{36}$ is turned off so that the constant current transistor $Q_5$ is rendered operative to transmit the input signal IN in the preamplifier 7. On the other hand, when the transistor $Q_{33}$ is kept off, the transistor $Q_{35}$ is turned off while the transistor $Q_{36}$ is turned on so that the constant current transistor $Q_{12}$ is rendered operative to carry out the muting operation in the pre-amplifier 7.

A resistor $R_{48}$ is interposed between a power source voltage $V_{cc2}$, which is higher than the bias voltage $V_{B1}$, and the collector of a transistor $Q_{32}$, and a control signal similar to the abovementioned control signal is applied to the base of the transistor $Q_{32}$, the collector voltage of which is in turn applied to the base of a switching transistor $Q_{16}$.

An intergration voltage of the power source voltage $V_{cc}$ due to an integration circuit $R_{103}$, $C_{107}$ formed by external components at the eighth terminal is applied to the base of a transistor $Q_{23}$ via a resistor $R_{21}$, and level shift diodes $Q_{24}$, $Q_{25}$ and a resistor $R_{22}$ are connected in series to the emitter of this transistor $Q_{23}$. The voltage drop across this resistor $R_{22}$ generates the above-mentioned control signal that is to be impressed upon the base of the transistor $Q_{32}$. The terminal voltage of this resistor $R_{22}$ is applied to the base of transistor $Q_{32}$ via a resistor $R_{29}$ and to the base of transistor $Q_{33}$ via a resistor $R_{23}$, respectively.

The integrated voltage from this eighth terminal when the power source is turned on is utilized for eliminating the popping noise when the power source is turned on.

On the other hand, a detuning detection signal $V_M$ generated by the aforementioned detuning detection circuit 4 is converted into a d.c. by an RC time constant circuit consisting of $R_{104}$, $R_{105}$ and a capacitor $C_{108}$, and is then applied to the seventh terminal. This detuning detection signal is applied to the base of a transistor $Q_{26}$ which is equipped with a diode $Q_{27}$ as a constant voltage element at its emitter and its collector is connected to the base of the abovementioned transistor $Q_{33}$.

Accordingly, the circuit including this transistor $Q_{26}$ forms the first mute control circuit 11.

The abovementioned detuning detection signal is applied to the second mute control circuit 12 via a resistor $R_{24}$ and the base and emitter of transistors $Q_{28}$, $Q_{29}$.

The second mute control circuit 12 employs: a Schmidt circuit consisting of a reference voltage circuit formed by differential transistors $Q_{39}$, $Q_{40}$ equipped with a resistor $R_{38}$ at their common emitters, a resistor $R_{41}$, a transistor $Q_{45}$ of the diode type, a diode $Q_{46}$, and voltage dividing resistors $R_{39}$, $R_{40}$ interposed between the collector and emitter of the transistor $Q_{45}$ for generating a reference voltage to be applied to the base of one ($Q_{40}$) of the transistors $Q_{39}$, $Q_{40}$. A current feedback circuit as a current mirror circuit is interposed between the collector and the base of the other transistor $Q_{39}$ and is composed of transistors $Q_{43}$, $Q_{44}$ and emitter resistors $R_{36}$, $R_{37}$. This Schmidt circuit has hysteresis with respect to an applied voltage which turns it on and an applied voltage which turns it off. Diodes $Q_{41}$, $Q_{42}$ for performing the voltage clamp are connected to the base of the abovementioned transistor $Q_{39}$ and the detuning detection signal obtained from the emitter of the transistor $Q_{29}$ is applied, via a resistor $R_{27}$, to an inverter circuit consisting of a transistor $Q_{30}$ and a resistor $R_{50}$. A transistor $Q_{31}$, which is controlled by the collector output of the transistor $Q_{30}$, is connected to the base of the transistor $Q_{39}$.

On the other hand, the output signal from the pre-amplifier 7 generated at the second terminal via the dielectric breakdown prevention resistor $R_{13}$ is applied to a PLL circuit 8 from the third terminal via a capacitor $C_{101}$. In the PLL circuit a 38 KHz switching signal for stereo demodulation in synchronism with 19 KHz pilot signal is formed, and is applied to the stereo demodulation circuit 9.

The stereo demodulation circuit 9 is composed of a known switching type stereo demodulation circuit. This stereo modulation circuit 9 consists of transistors $Q_{17}$–$Q_{22}$ forming a balanced-differential type multiplication circuit and resistors $R_{16}$–$R_{20}$. The stereo demodulation circuit 9 of this switching type was reported in the magazine "IEE TRANSACTIONS ON BROADCAST AND TELEVISION RECEIVERS", VOLUME BTR-14. NUMBER 3, p. 58–73, October, 1968, and a semiconductor integrated circuit for an FM stereo demodulation circuit using the PLL circuit was described in the aforementioned magazine "Electronics".

Reference numeral 13b represents a bias circuit for forming its bias voltage $V_{B3}$.

The output of this stereo demodulation circuit 9 passes through post-amplifiers 14L, 14R so that the left channel output is obtained from the fourth terminal and the right channel output is obtained from the fifth terminal. Lowpass filters 15L, 15R are also connected to the fourth and fifth terminals, respectively. Capacitors $C_{103}$, $C_{104}$ and $C_{105}$, $C_{106}$ are connected in series and are also connected to the fourth and fifth terminals, respectively. Transistors $Q_{100}$, $Q_{101}$ are interposed between the respective junctions of these series capacitors and a ground potential terminal. These capacitors and transistors together form the muting circuit 10.

The bases of these transistors $Q_{100}$, $Q_{101}$ are connected to the sixth terminal via resistors $R_{101}$, $R_{102}$, respectively.

The collector voltage of transistor $Q_{36}$, which permits the muting operation in the pre-amplifier 7, is applied to the base of transistor $Q_{48}$ via a resistor $R_{44}$ and transistor $Q_{51}$ generates a mute control output signal. Diodes $Q_{49}$, $Q_{50}$ connected to the collector of the transistor $Q_{48}$ apply an operating voltage to this transistor $Q_{51}$. A resistor $R_{45}$ is interposed between the series diodes $Q_{49, 50}$ and the collector of the transistor $Q_{48}$, and a resistor $R_{46}$ is connected in parallel to the series diodes $Q_{49}$, $Q_{50}$.

On the other hand, the feedback output current of the abovementioned Schmidt circuit is also applied to the base of the output transistor $Q_{47}$, and a mute control output signal to the sixth terminal is generated via a resistor $R_{49}$ from the commonly connected collectors of the output transistors $Q_{51}$, $Q_{47}$.

The circuit of this embodiment operates in the following manner.

First, when the power source is turned on, transistor $Q_{32}$ is kept off and transistor $Q_{16}$ is kept on until the integration voltage to the eighth terminal reaches 4 $V_{BE}$ (base-to-emitter voltage of the transistor or forward voltage of the diode). Accordingly, in response to the rising bias voltage which is following the power source voltage $V_{cc1}$, the coupling capacitor $C_{100}$ charges and the bias voltage of the transistor $Q_1$ rises rapidly so that the bias voltage of the transistors $Q_3$, $Q_{11}$ generated by the feedback also rises rapidly.

On the other hand, during the period until the abovementioned integration voltage reaches 5 $V_{BE}$, the transistors $Q_{33}$ and $Q_{35}$ are kept off so that the constant current transistor $Q_5$ is turned off while the constant current transistor $Q_{12}$ is turned on. As the transistor $Q_{36}$ is turned on, the transistors $Q_{48}$, $Q_{51}$ are also turned on. Accordingly, the transistors $Q_{100}$ $Q_{101}$ of the muting circuit 10 are turned on and carry out the muting operation in the pre-amplifier 7 and in the muting circuit 10.

Before the integration voltage reaches 5 $V_{BE}$, the transistor $Q_{32}$ is turned on and hence, the transistor $Q_{16}$ is turned off. When the integration voltage reaches 5 $V_{BE}$, the transistors $Q_{33}$, $Q_5$ are turned on while the transistors $Q_{48}$, $Q_{51}$ are turned off so that the muting operation is released in the pre-amplifier circuit 7 and in the muting circuit 10.

Since in the rise of the bias voltage of the transistor $Q_1$ no delay is caused by the time constant determined by the capacitor $C_{100}$ and the resistor $R_7$, no difference is generated between the bias voltage $V_{B1}$ and the bias voltage formed by the feedback operation. Consequently, the popping noise can be prevented.

On the other hand, when tuning to a desired station, the integration voltage at the eighth terminal is fully charged to the power source voltage $V_{cc}$, so at the time of detuning the voltage at the seventh terminal is at the high level and transistor $Q_{26}$ is turned on. Accordingly, transistor $Q_{33}$ is turned off, whereby the muting operation is carried out in the pre-amplifier 7 and in the muting circuit 10. In this case, since the eighth terminal is at the high level, transistor $Q_{32}$ is turned on and the switching transistor $Q_{16}$ connected to the bias resistor $R_7$ is turned off.

Since the seventh terminal is at the high level due to the abovementioned detuning detection signal, the transistor $Q_{39}$ forming the Schmidt circuit is turned on and the muting circuit 10 is also made to perform the muting operation by this mute control circuit 12.

When the detuning detection signal $V_M$ drops below 2 $V_{BE}$ upon tuning, the transistor $Q_{26}$ is turned off and the transistor $Q_{33}$ is turned on so that the muting operation in the pre-amplifier 7 is released. In this case, due to the S characteristic of the FM detection output, the voltage fluctuation occurs but is removed by the continued muting by muting circuit 10.

When the detuning detection signal $V_M$ drops further below $V_{BE}$, transistor $Q_{30}$ is turned off to thereby turn on transistor $Q_{31}$ so that the differential transistor $Q_{39}$ is compulsively turned off, and the action muting circuit 10 is released at this time.

When the detuning is again effected and the rise voltage of its detection signal $V_M$ reaches $V_{BE}$, transistor $Q_{30}$ is turned on, turning off transistor $Q_{31}$. In this case, however, a voltage higher than $V_{BE}$, e.g., about 1.5 $V_{BE}$, is applied to the base of the transistor $Q_{40}$ by the transistors $Q_{45}$, $Q_{46}$ and the resistors $R_{39}$, $R_{40}$, and consequently the transistor $Q_{39}$ is kept off and the muting circuit 10 does not operate yet.

When the detuning detection signal $V_M$ reaches the abovementioned reference voltage (1.5 $V_{BE}$), transistor $Q_{39}$ is turned on, and muting is effected in the muting circuit 10.

In this manner, the mute control circuit 12 has the hysteresis characteristic having its discrimination levels at $V_{BE}$ and 1.5 $V_{BE}$.

Next, when the detuning detection signal reaches 2 $V_{BE}$, transistor $Q_{26}$ is turned on to actuate transistor $Q_{33}$ and begin muting in the pre-amplifier 7. In this case, too, due to the S characteristic in the FM detection output, the voltage fluction occurs but is eliminated because the muting circuit 10 has already started operating.

In this embodiment, the hysteresis characteristic is provided by use of the Schmidt circuit because, as can be clearly understood from the operation waveform diagram of FIG. 9, no problem occurs even if the difference of timing between the start of the muting operation in the pre-amplifier 7 and the start of the muting operation in the muting circuit 10 at the beginning of the muting operation is made smaller than the difference of timing at the release of the muting operation. In other words, since the differential waveform in the d.c. voltage fluctuation of the S characteristic is produced as the popping noise, it is necesary for the timing difference to correspond to the pulse width of this popping noise in order to release the muting operation silently, and the timing of muting circuit 10 should be slightly advanced at the start of the muting operation. Additionally, the abovementioned hysteresis characteristic is an extremely effective means for compensating for unstability of the detuning detection signal.

The second invention of this application is not limited to the abovementioned embodiment in particular, and various circuit constructions may be employed for each circuit so long as the same operation can be provided.

Further, the monolithic semiconductor integrated circuit $IC_2$, forming the FM stereo demodulation circuit may be provided with additional circuits such as a circuit for FM stereo-monaural detection, selection, display and the like, a circuit for cancelling the 19 KHz pilot signal, and so forth.

Any signal can be used as the detuning detection signal so long as it is capable of discriminating between tuning and detuning, and the polarity of its signal level may become simultaneously high levels. In this case, the discrimination level may be set to the reverse level difference.

What is claimed is:

1. A muting circuit comprising:
   (1) first and second transistors having the emitters thereof connected to each other;
   (2) third and fourth transistors having the emitters thereof connected to each other;
   (3) a first constant current source connected commonly to the emitters of said first and second transistors;
   (4) a second constant current source connected commonly to the emitters of said third and fourth transistors;
   (5) a coupling capacitor for feeding an input signal to the base of said first transistor;
   (6) a bias resistor having one end thereof connected to the base of said first transistor and the other to the base of said third transistor;
   (7) bias voltage generation means connected to the base of said third transitor and to said other end of said bias resistor;
   (8) load means connected to the collector of said second transistor and to the collector of said fourth transistor;
   (9) a feedback circuit connected between said load means and both bases of said second and fourth transistors;
   (10) means for alternatively controlling and bringing either one of said first and second constant current sources into the operative state and the other into the inoperative state; and
   (11) a switching element connected between said one end and said other end of said bias resistor and actuated into the ON state for a predetermined period after making of the power source.

2. The muting circuit as defined in claim 1 wherein said first constant current source includes a fifth transistor having the collector and emitter thereof connected to the emitters of said first and second transistors and to a reference potential, respectively; said second constant current source includes a sixth transistor having the collector and emitter thereof connected to the emitters of said third and fourth transistors and to said reference potential, respectively; and said switching element includes a seventh transistor having the collector-to-emitter path thereof connected in parallel to both ends of said bias resistor.

3. The muting circuit as defined in claim 1 wherein a time constant circuit is connected between said power source and said referential potential and the bases of said fifth, sixth and seventh transistors are controlled on the basis of the output signal of said time constant circuit.

4. An FM radio receiver comprising:
   (1) an FM intermediate frequency amplification stage;
   (2) an FM detector having the input terminal thereof connected to the output terminal of said FM intermediate frequency amplification stage;
   (3) a detuning detection circuit responsive to the intermediate frequency signal of said FM intermediate frequency amplification stage;
   (4) a pre-amplifier having the input terminal thereof connected to the output terminal of said FM detector, the signal transmitting operation of said pre-amplifier being virtually inhibited when a control input signal is applied to the control input terminal of said pre-amplifier;
   (5) a phase locked loop circuit for obtaining a 38 KHz switching signal in synchronism with a 19 KHz pilot signal contained in a stereo composite signal obtained from said FM detector;
   (6) a stereo demodulation circuit for providing right and left channel demodulation output signals when applied with said stereo composite signal and said 38 KHz switching signal;
   (7) a muting circuit having first and second input terminals, first and second output terminals and a control input terminal, said first and second input terminals receiving said right and left channel demodulation output signals, respectively, and said control input terminal receiving the control input signal, thereby virtually inhibiting the signal transmitting operation between said first input terminal and said first output terminal and the signal transmitting operation between said second input terminal and said second output terminal, respectively;

(8) a first mute control circuit receiving at the input terminal thereof the output signal of said detuning detection circuit and applying the output signal thereof to said control input terminal of said pre-amplifier, said first mute control circuit further having a first discrimination level with respect to the output signal of said detuning detection signal to be applied to the input terminal thereof; and (9) a second mute control circuit receiving at the input terminal thereof the output signal of said detuning detection circuit and applying the output signal thereof to the control input terminal of said muting circuit, said second mute control circuit further having a second discrimination level with respect to the output signal of said detuning detection circuit to be applied to the input terminal thereof;

whereby a level difference is set between said first discrimination level and said second discrimination level so that when the reception condition of said FM radio receiver changes from the tuning state to the detuning state, the signal transmitting operation of said muting circuit is virtually inhibited and thereafter the signal transmitting operation of said pre-amplifier is virtually inhibited.

5. The FM radio receiver as defined in claim 4 wherein there is further disposed a detection circuit for detecting the turning on of the power source, and the signal transmitting operation of said pre-amplifier and that of said muting circuit are virtually inhibited on the basis of the output signal of said detection circuit for detecting the turning on of the power source.

6. The FM radio receiver as defined in claim 4 or 5 wherein said second discrimination level of said second mute control circuit is determined by the hysteresis of a Schmidt circuit, and a level difference is provided between the start level of virtual inhibition of the signal transmitting operation of said Schmidt circuit and the release level of virtual inhibition of the signal transmitting operation of said muting circuit.

7. The FM radio receiver as defined in claim 4 or 5 wherein all of said pre-amplifier, said phase locked loop circuit, said stereo demodulation circuit, said first mute control circuit and said second mute control circuit are formed inside one monolithic semiconductor integrated circuit.

* * * * *